US 8,788,087 B2

(12) United States Patent
Hashimoto et al.

(10) Patent No.: US 8,788,087 B2
(45) Date of Patent: Jul. 22, 2014

(54) ROBOT AND INSTRUCTION METHOD THEREOF

(75) Inventors: Yasuhiko Hashimoto, Kobe (JP); Nobuyasu Shimomura, Kobe (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 384 days.

(21) Appl. No.: 13/003,081

(22) PCT Filed: Jul. 10, 2008

(86) PCT No.: PCT/JP2008/062490
§ 371 (c)(1),
(2), (4) Date: Jan. 7, 2011

(87) PCT Pub. No.: WO2010/004635
PCT Pub. Date: Jan. 14, 2010

(65) Prior Publication Data
US 2011/0118873 A1    May 19, 2011

(51) Int. Cl.
*G06F 7/00*   (2006.01)
(52) U.S. Cl.
USPC ............................ 700/218; 700/223; 700/231
(58) Field of Classification Search
None
See application file for complete search history.

(56) References Cited

U.S. PATENT DOCUMENTS

| | | | | |
|---|---|---|---|---|
| 5,475,889 | A | * | 12/1995 | Thrasher et al. ............. 15/88.3 |
| 5,789,890 | A | * | 8/1998 | Genov et al. ................. 318/567 |
| 6,242,879 | B1 | | 6/2001 | Sagues et al. |
| 2001/0020199 | A1 | * | 9/2001 | Bacchi et al. ................. 700/245 |

FOREIGN PATENT DOCUMENTS

| | | | |
|---|---|---|---|
| DE | 199 10 534 A1 | 10/1999 | |
| EP | 0469151 A1 * | 4/2001 | ............. H02P 23/00 |
| JP | A-62-054303 | 3/1987 | |
| JP | A-08-071969 | 3/1996 | |
| JP | A-08-288365 | 11/1996 | |
| JP | A-2002-018753 | 1/2002 | |
| JP | A-2007-227627 | 9/2007 | |

OTHER PUBLICATIONS

International Preliminary Report on Patentability issued in Application No. PCT/JP2008/062490; Dated Feb. 17, 2011.
European Search Report issued in Application No. 08778038.3; Dated Apr. 12, 2012.
Jul. 6, 2012 Notification of Reasons for Rejection issued in Japanese Patent Application No. 2010-519598 (with English-language translation).
International Search Report issued in Application No. PCT/JP2008/062490; Dated Aug. 12, 2008.

* cited by examiner

*Primary Examiner* — Gene Crawford
*Assistant Examiner* — Lester Rushin
(74) *Attorney, Agent, or Firm* — Oliff PLC

(57) ABSTRACT

A robot arm having a distal end to which a wrist axis is rotatably provided; arm drive unit, each configured to move the robot arm; a wrist axis drive unit configured to rotate the wrist axis; and a robot control unit configured to control the arm drive unit and wrist axis drive unit. The robot control unit is configured to control the arm drive unit to move the distal end of the robot arm to bring a contact member attached to the wrist axis into contact with an instruction target, thereby detecting a posture of the robot arm and an angular position of the wrist axis when the wrist axis begins to be angularly displaced due to the contact between the contact member and the instruction target, thus determining a position of an instruction point.

12 Claims, 6 Drawing Sheets

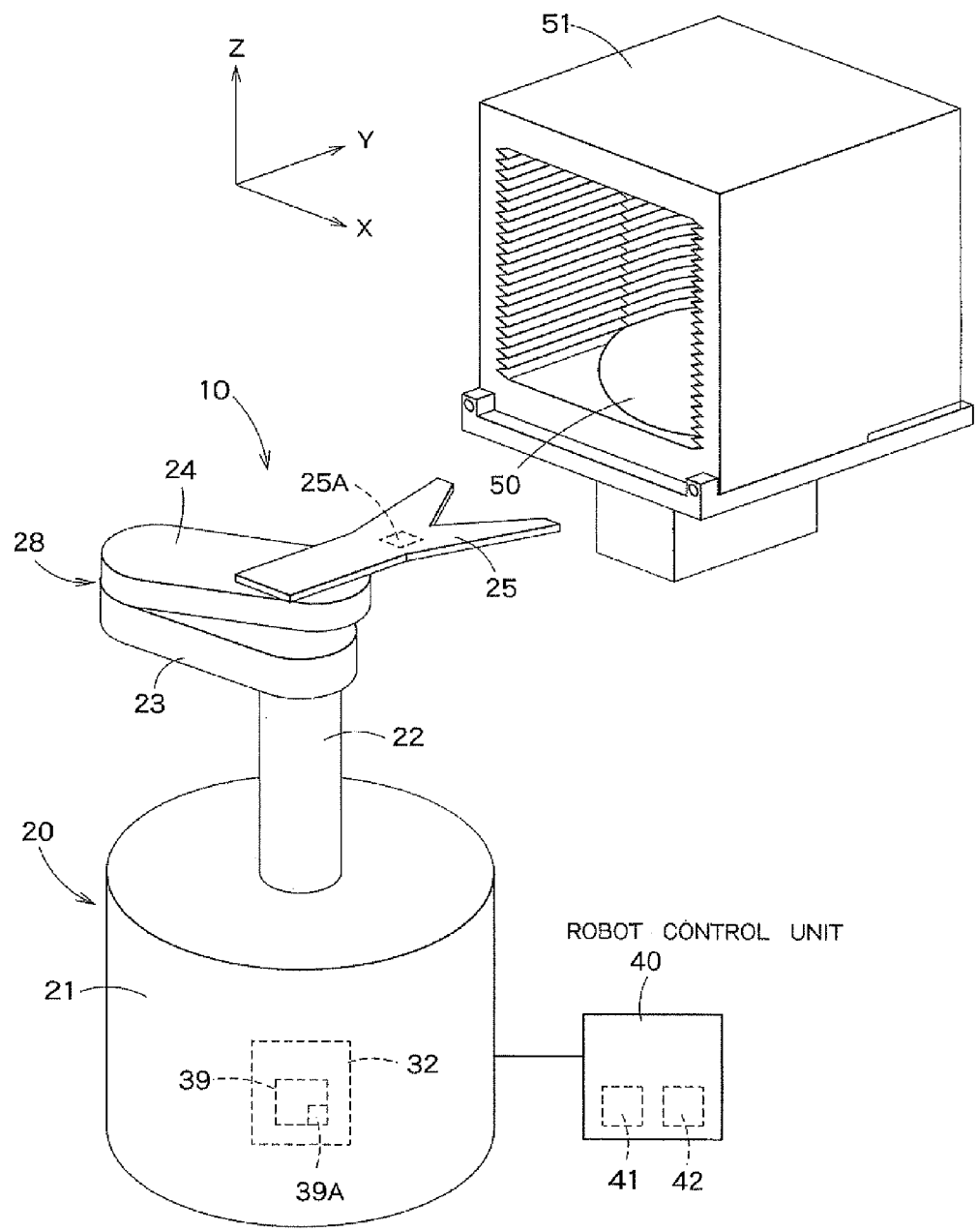
F I G. 1

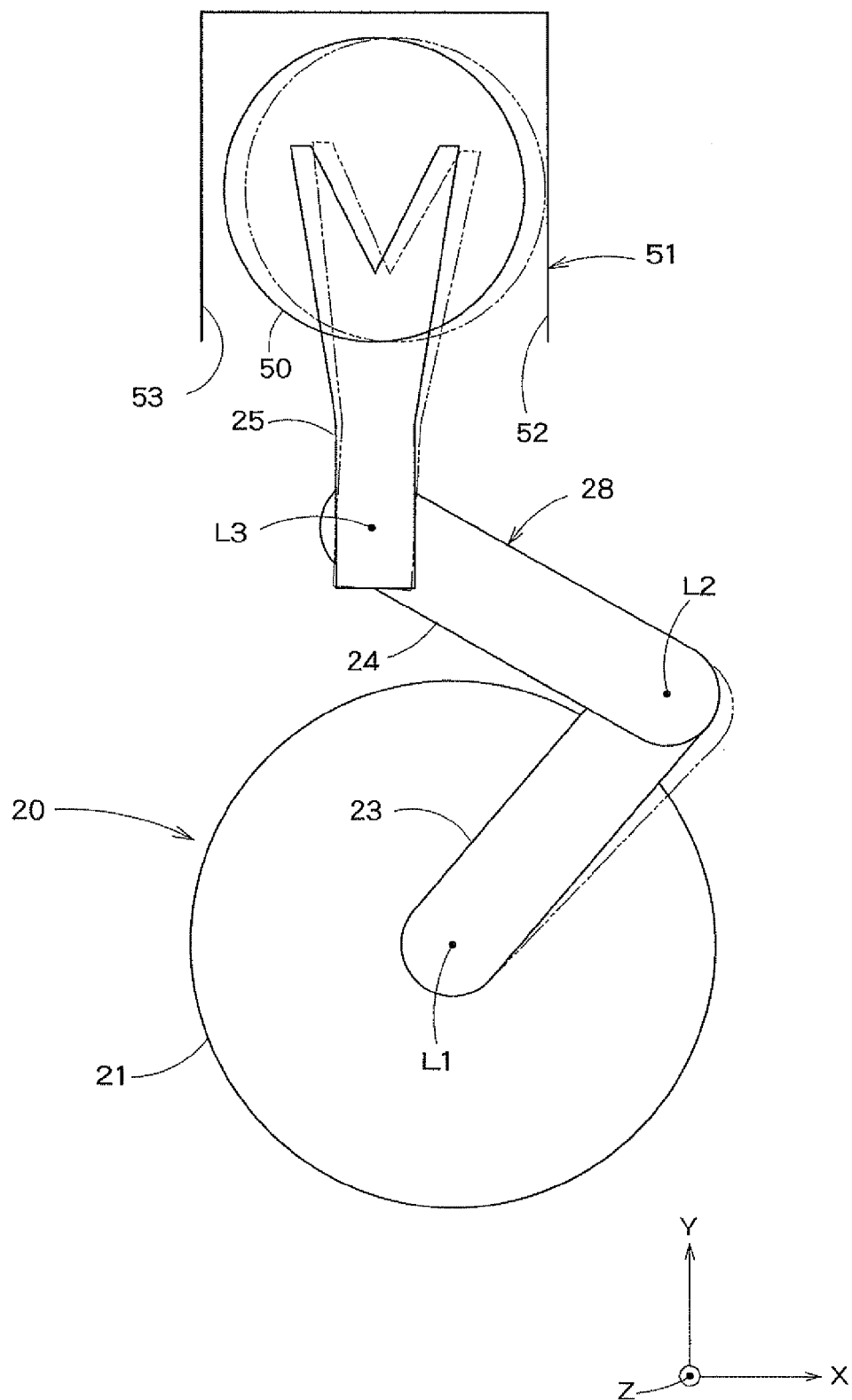
F I G. 4

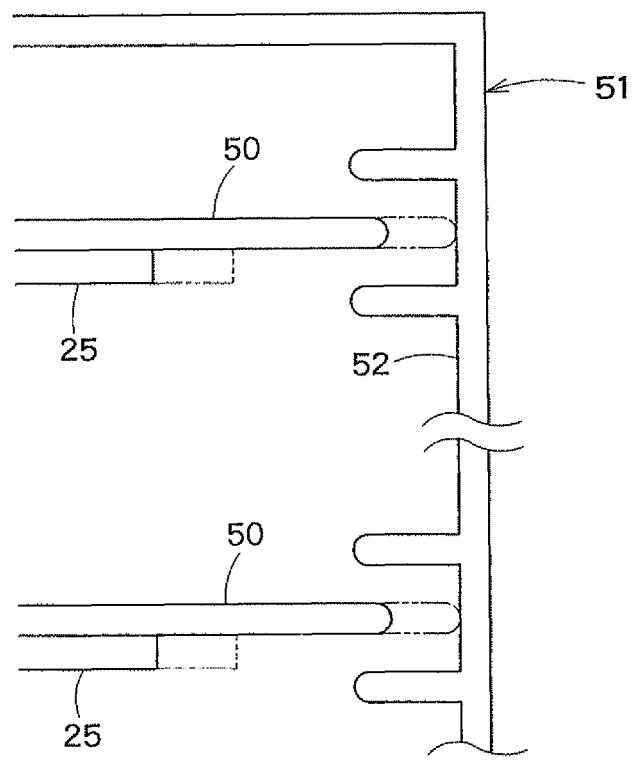
F I G. 5

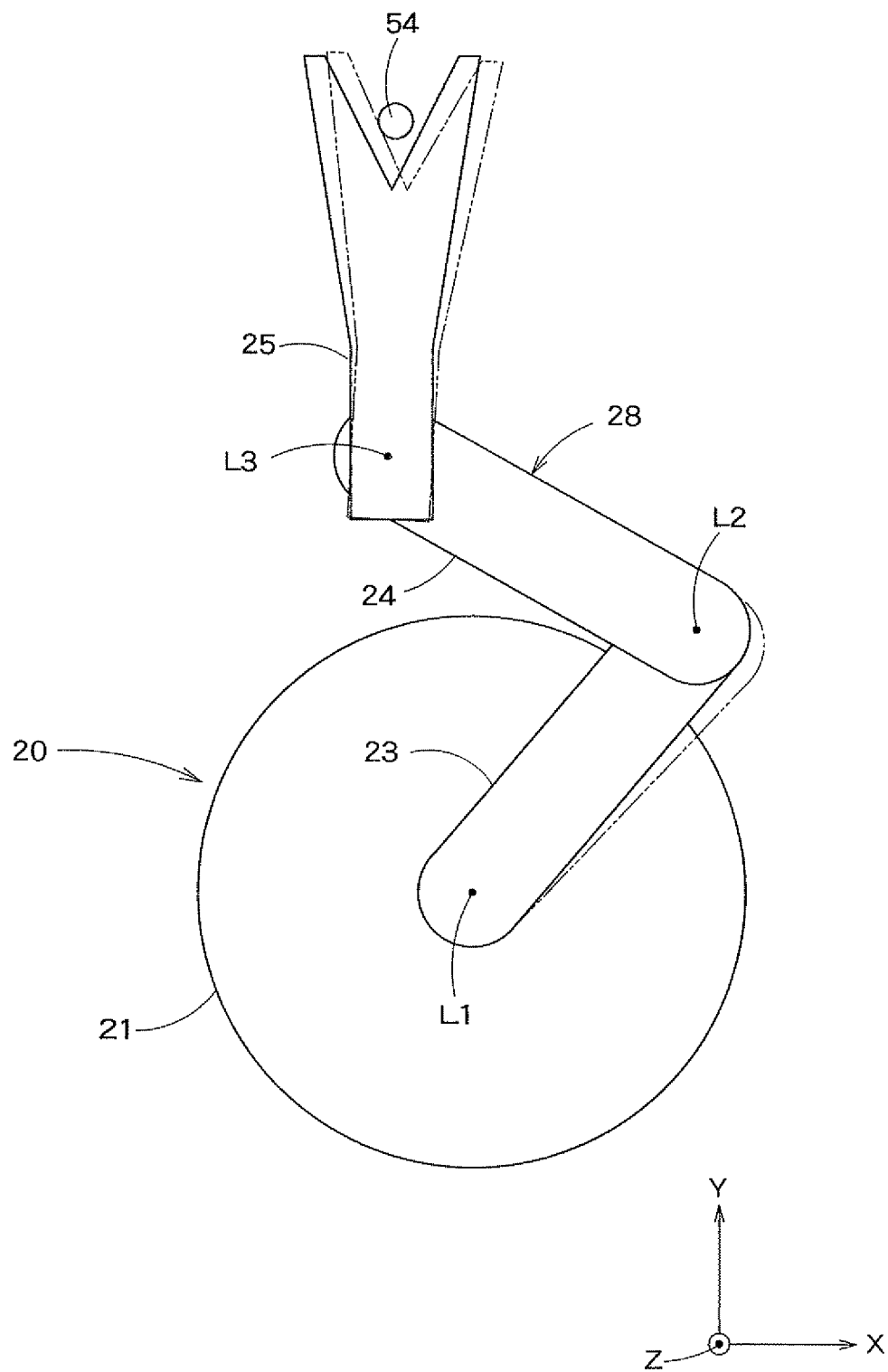
F I G. 6

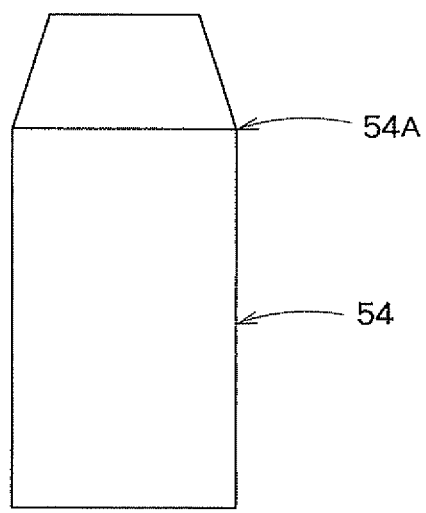
F I G. 7

ROBOT AND INSTRUCTION METHOD THEREOF

TECHNICAL FIELD

The present invention relates to a robot which can be instructed about a target position as well as to an instruction method thereof.

BACKGROUND ART

In the past, a robot provided with a movable or articulated arm has been used upon carrying a work, such as a silicon wafer used for manufacturing semiconductors, a glass substrate used for manufacturing a liquid crystal display panel, and the like. The robot of this type has a function that can be instructed in advance about a predetermined target position in order to accurately carry the work to the predetermined position.

In recent years, with an attempt to manufacture more large-sized semiconductor wafers and/or glass substrates, instruction to the robot has been more difficult and thus required higher skill of an operator. If the skill of the operator is not sufficient, serious mistakes may tend to occur upon instructing the robot. Therefore, there is a need for a technique for adequately instructing the robot about an accurate position without relying on any highly specialized skill of the operator.

Patent Document 1 describes one method of obtaining an instruction point by detecting a position of a target by using a three-axis-scalar type robot. In this method, an end effector of the robot is moved toward the target attached to a cassette or the like, so as to be in contact with the target. At this time, changes in torque and speed are detected. Then, the detected changes are compared between the case in which the end effector is contacted with the target and the case in which the end effector is not contacted with the target, respectively. In this way, a contact point of the end effector with the target can be detected, thereby calculating the position of the target from the detected contact point, thus obtaining the instruction point.

Patent Document 1: U.S. Pat. No. 6,242,879

However, in the conventional instruction method described above, when the end effector is contacted with the target, the end effector and/or target may be deformed as well as unwanted particles may be generated. In order to avoid such problems, the robot should be moved at a very low speed. In such a case, however, accuracy of positional detection may tend to be significantly deteriorated due to various fluctuation factors and other factors that may be changed with time in a drive system of the robot. In this regard, the fluctuation factors include fluctuation due to the torque, friction and the like, while the factors that may be changed with time include hysteresis and the like.

DISCLOSURE OF INVENTION

The present invention was made in light of the above problems, and therefore it is an object of this invention to provide a new robot and a new instruction method thereof, which can detect the target position with higher accuracy, while preventing the deformation of the end effector and/or target as well as avoiding the generation of unwanted particles.

The robot according to the present invention includes: a robot arm having a distal end to which a wrist axis is rotatably provided; arm drive unit configured to move the robot arm; wrist axis drive unit configured to rotate the wrist axis; and robot control unit configured to control the arm drive unit and the wrist axis drive unit, wherein the robot control unit is configured to control the arm drive unit to move the distal end of the robot arm so as to bring a contact member attached to the wrist axis into contact with an instruction target, thereby detecting a posture of the robot arm and an angular position of the wrist axis at a point of time when the wrist axis begins to be angularly displaced due to the contact between the contact member and the instruction target, then determining a position of an instruction point based on detection results of the posture of the robot arm and the angular position of the wrist axis.

Preferably, the wrist axis drive unit includes a motor configured to rotate the wrist axis, and an encoder provided to the motor. The robot control unit is configured to detect an angular displacement of the wrist axis by changes of a position of the encoder.

Preferably, the robot further includes an end effector attached to the wrist axis, wherein the contact member is the end effector.

Preferably, the robot further includes an end effector attached to the wrist axis, wherein the contact member is a member held by the end effector.

Preferably, the end effector has holding unit configured to hold a plate member. The contact member is the plate member held by the end effector. The instruction target is a container for containing the plate member.

Preferably, the robot control unit is configured to set a control loop gain of the wrist axis drive unit at substantially zero at a point of time when the contact member is expected to be in contact with the instruction target, based on a preset temporary positional data about the instruction target.

Preferably, the robot control unit is configured to set the control loop gain at substantially zero immediately before the point of time when the contact member is expected to be in contact with the instruction target.

Preferably, the robot arm is configured to be moved while having degrees of freedom in X-axial, Y-axial and Z-axial directions.

Preferably, the robot control unit is configured to detect a plurality of instruction points located in different positions.

Preferably, the wrist axis can be rotated about a rotation axis in the Z-axial direction.

Preferably, the robot arm is configured to be moved while having degrees of freedom in the X-axial, Y-axial and Z-axial directions. The robot control unit is configured to bring the contact member into contact with the target in a plurality of different positions in the Z-axial direction, the target taking a position changed in the X-axial and Y-axial directions along the Z-axis, whereby the robot control unit can determine a position of the instruction point in the Z-axial direction based on the detection results in the plurality of different positions.

The present invention is a method of instructing the robot defined above about the position of the instruction point, including: moving the distal end of the robot arm by controlling the arm drive unit by using the robot control unit so as to bring the contact member attached to the wrist axis into contact with the instruction target; and detecting the posture of the robot arm and the angular position of the wrist axis at the point of time when the wrist axis begins to be angularly displaced due to the contact between the contact member and the instruction target, then determining the position of the instruction point based on the detection results.

BRIEF DESCRIPTION OF DRAWINGS

FIG. 1 is a perspective view showing the robot according to an embodiment of the present invention together with a wafer cassette.

FIG. 4 is a plan view for illustrating an instruction operation for the robot shown in FIG. 1.

FIG. 5 is a front view for illustrating the instruction operation for the robot shown in FIG. 1.

FIG. 6 is a plan view for illustrating another instruction operation for the robot shown in FIG. 1.

FIG. 7 is a side view of a target shown in FIG. 6.

BEST MODE FOR CARRYING OUT THE INVENTION

Figure 2:
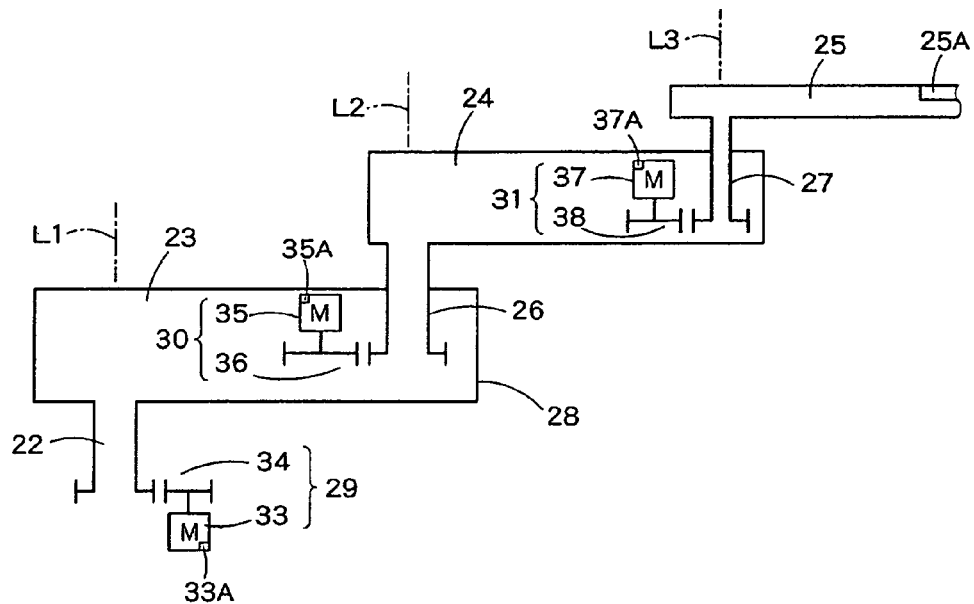
FIG. 2 is a diagram showing an internal structure of a robot arm of the robot shown in FIG. 1.

Hereinafter, the robot, as an embodiment of the present invention, and instruction method thereof will be described with reference to the drawings.

As shown in FIG. 1, an exemplary robot 10 according to this embodiment includes a robot main body 20 configured to carry a plate member (or work), such as a semiconductor wafer 50 or the like, and a robot control unit 40 configured to control an operation of the robot main body 20.

The robot main body 20 is configured to carry out the semiconductor wafer 50 from a wafer cassette 51 as well as to carry in the semiconductor wafer 50 to the cassette 51. It is noted that the wafer cassette 51 was produced based on the SEMI (Semiconductor Equipment and Materials International) standard.

The robot main body 20 has a robot base 21. An arm shaft 22, which extends in a vertical direction or Z-axial direction and is capable of moving in the vertical direction, is provided to the robot base 21. At a top end of the arm shaft 22, a proximal end of a first arm 23 is fixed. At a distal end of the first arm 23, a proximal end of a second arm 24 is rotatably attached.

At a distal end of the second arm 24, a hand 25 that can serve as an end effector is rotatably provided. The hand 25 is configured such that the semiconductor wafer 50 can be placed thereon. In order to releasably hold the wafer 50 placed on the hand 25, the hand 25 includes a holding unit 25A utilizing a vacuum suction mechanism and/or grasping mechanism.

The robot control unit 40 is implemented by a computer and includes a memory 41, in which an operational program for controlling the operation of the robot main body 20 is stored, and a CPU 42 configured to control the robot main body 20 by executing the operational program stored in the memory 41.

In the memory 41, data concerning the instruction point for controlling the operation of the robot main body 20 can also be stored. Thus, the hand 25 can be moved to a predetermined position based on such instruction point data stored in the memory 41. Additionally, data concerning the shape and size of the hand 25 as well as data concerning the shape and size of the wafer held by the hand 25 can also be stored in the memory 41.

As shown in FIG. 2, the second arm 24 is fixedly attached, at its proximal end, to a second arm rotation shaft 26 rotatably provided at the distal end of the first arm 23. The hand 25 is fixedly attached, at its proximal end, to a wrist axis 27 rotatably provided at the distal end of the second arm 24.

In this manner, the robot arm 28 of the robot main body 20 includes the arm shaft 22, first arm 23, second arm 24, hand 25, second arm rotation shaft 26 and wrist axis 27. The robot arm 28 of this type is also referred to as a scalar-type horizontal articulated arm. By controlling the operation of the robot arm 28 by using the robot control unit 40, the hand 25 can be moved in the X-axial, Y-axial and Z-axial directions, respectively, to a desired position.

Figure 3:
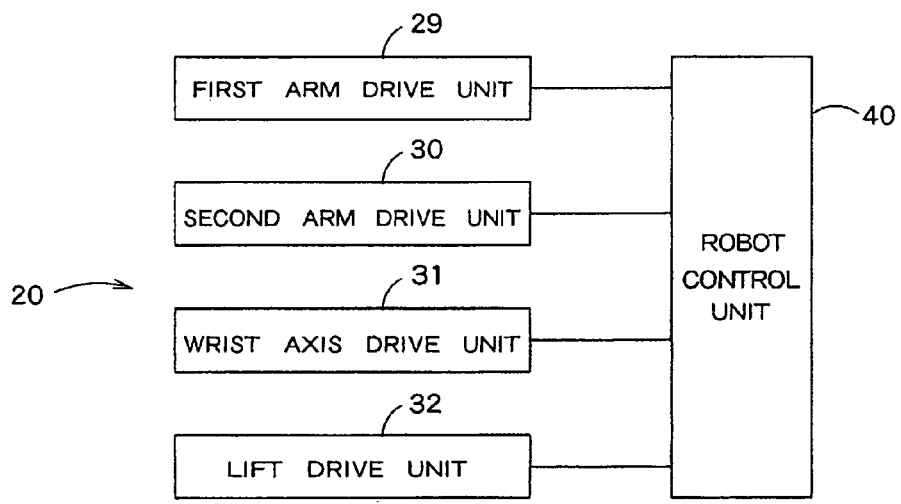
FIG. 3 is a block diagram showing construction of a control and drive system of the robot shown in FIG. 1.

As shown in FIGS. 2 and 3, the robot main body 20 further includes a first arm drive unit 29 configured to rotate the first arm 23, a second arm drive unit 30 configured to rotate the second arm 24, a wrist axis drive unit 31 configured to rotate the wrist axis 27, and a lift drive unit 32 configured to vertically drive the arm shaft 22.

The first drive unit 29 is located in an internal space of the robot base 21 and includes a servomotor 33 and a power transmission mechanism 34 thereof. The second arm drive unit 30 is located in an internal space of the first arm 23 and includes a servomotor 35 and a power transmission mechanism 36 thereof. The wrist axis drive unit 31 is located in an internal space of the second arm 24 and includes a servomotor 37 and a power transmission mechanism 38 thereof. These servomotors 33, 35, 37 incorporate encoders 33A, 35A, 37A, respectively.

For each power transmission mechanism 34, 36, 38, a gear transmission mechanism including a reduction gear can be used. In this case, power of each servomotor 33, 35, 37 is first transmitted to an input side of the reduction gear, and the torque is then amplified at a predetermined amplification ratio, while the rotation speed is reduced at a predetermined reduction ratio. In this manner, the resultant power will be outputted from an output side of the reduction gear. With such power outputted from the output side of the reduction gear, the arm shaft 22, second arm rotation shaft 26 and wrist axis 27 will be rotated, respectively. Thus, the first arm 23, second arm 24 and hand 25 will be rotated, respectively.

Alternatively, the arm shaft 22, second arm rotation shaft 26 and/or wrist axis 27 may be driven by a direct drive motor.

The lift drive unit 32 is provided in the robot base 21 and implemented by a boil-screw mechanism using a rotary motor, wherein angular displacement of the rotary motor can be optionally controlled. For instance, the lift drive unit 32 includes a screw rod, a mating member configured to be meshed with the screw rod, and the rotary motor configured to rotate the screw rod. In this case, the arm shaft 22 is fixed in position to the mating member. For the rotary motor of the lift drive unit 32, a servomotor 39 incorporating an encoder 39A is used.

In the robot main body 20 having the construction as described above, the arm shaft 22 is rotated about a rotation axis L1, relative to the robot base 21, by the first arm drive unit 29. Consequently, the first arm 23 is rotated about the rotation axis L1 relative to the robot base 21.

The second arm rotation shaft 26 is rotated about a rotation axis L2, relative to the first arm 23, by the second arm drive unit 30. Thus, the second arm 24 is rotated about the rotation axis L2 relative to the first arm 23.

Further, the wrist axis 27 is rotated about a rotation axis L3, relative to the second arm 24, by the wrist axis drive unit 31. As a result, the hand 25 is rotated about the rotation axis L3 relative to the second arm 24.

The rotation axes L1, L2, L3 are parallel with one another, and extend in the Z-axial direction (or vertical direction), respectively. Namely, the robot arm 28 having such construction as described above can be moved with degrees of freedom in the X-axial, Y-axial and Z-axial directions.

The robot control unit 40 can perform feed-back control for the drive unit 29, 30, 31, 32 by obtaining angular positions of the servomotors 33, 35, 37, 39 from the encoders 33A, 35A, 37A, 39A of the respective servomotors 33, 35, 37, 39 of the first arm drive unit 29, second arm drive unit 30, wrist axis drive unit 31 and lift drive unit 32, respectively. As such, the hand 25 can be aligned with a target position with high accuracy.

Next, a method of instructing the robot 10 about the target position will be described with reference to FIGS. 4 and 5. As will be discussed below, the target is the wafer cassette 51 used for containing the semiconductor wafers 50.

The CPU 42 of the robot control unit 40 reads temporary positional data concerning the wafer cassette 51 and stored in the memory 41, then controls the first arm drive unit 29, second arm drive unit 30, wrist axis drive unit 31 and lift drive unit 32, respectively, so as to insert each wafer 50 held by the hand 25 into the cassette 51.

Based on the SEMI standard, the wafer cassette 51 is sized to be slightly greater than a diameter of the wafer 50 in the horizontal direction between its left and right inner wall faces 52, 53. Thus, a suitable gap for allowing the wafer 50 to slightly move in the horizontal or lateral direction is provided on each side of the wafer 50 when the wafer 50 is inserted in the cassette 51.

Next, the robot control unit 40 sets a control loop gain of the wrist axis drive unit 31 at substantially zero (0), while bringing the wafer 50 held by the hand 25 into contact with one inner wall face 52 (or 53) of the cassette 51 (or into a state depicted by imaginary lines in FIGS. 4 and 5) by controlling and driving at least one of the first arm drive unit 29 and second arm drive unit 30.

In this regard, "the robot control unit 40 sets the control loop gain of the wrist axis drive unit 31 at substantially zero" is meant that the robot control unit 40 changes the control loop gain into a possibly small value including zero from a servo-gain obtained upon a usual operation. In this way, contact reaction force that will be generated when some external force is exerted on the wrist axis drive unit 31 or when the hand 25 is in contact with the cassette 51 can be minimized. Therefore, the angular position of the servomotor 37 of the wrist axis drive unit 31 can be changed substantially freely with substantially no influence caused by such contact reaction force. It is noted that this operation also includes setting the control loop gain at zero.

When the wafer 50 is in contact with the inner wall face 52 (or 53) of the cassette 51, the hand 25 will be angularly displaced about the rotation axis L3 together with the wafer 50, because the control loop gain of the wrist axis drive unit 31 is set at substantially zero. Thus, the wrist axis 27 will also be angularly displaced. Then, this angular displacement of the wrist axis 27 is transmitted to the servomotor 37 via the power transmission mechanism 38, thereby angularly moving the servomotor 37.

In this manner, the servomotor 37 will be angularly displaced when the wafer 50 is in contact with the inner wall face 52 (or 53) of the cassette 51. Thus, a point of time when the servomotor 37 begins to be angularly displaced can be detected by the change of each position of the encoders. Then, a posture of the robot arm 28 and the angular position of the wrist axis 27 at the detected point of time will be detected.

In this case, information about the posture of the robot arm 28 can be obtained from the encoders 33A, 35A, 39A of the respective servomotors 33, 35, 39 of the first arm drive unit 29, second arm drive unit 30 and lift drive unit 32, respectively. Meanwhile, information about the angular position of the wrist axis 27 can be obtained from the encoder 37A of the servomotor 37 of the wrist axis drive unit 31.

The robot control unit 40 detects each position of the cassette inner wall face 52 (or 53) in an X-Y plane based on data of the shape and size of the wafer 50 stored in the memory 41 as well as on detection results concerning the posture of the robot arm 28 and the angular position of the wrist axis 27 upon the contact of the wafer 50 with the cassette 51.

With such an operation described above, the positional data of the left and right inner wall faces 52, 53 of the wafer cassette 51 can be obtained. Consequently, a central position (or instruction point) in the lateral direction of the wafer cassette 51 can be determined.

Furthermore, as shown in FIG. 5, instruction data may be obtained with respect to the inner wall faces 52, 53 of the wafer cassette 51 in different positions in the Z-axial direction. In this manner, the position of the wafer cassette 51 can be determined more accurately.

In regard to the timing on which the control loop gain of the wrist axis drive unit 31 is set at substantially zero, the control loop gain may be set at substantially zero immediately before a point of time when the wafer 50 is expected to be in contact with the cassette inner wall face 52 (or 53), based on each preset temporary positional data of the cassette inner wall faces 52, 53.

As discussed above, in the robot 10 according to this embodiment, the wrist axis 27 and wrist axis drive unit 31 can serve as the so-called switch upon an instruction operation of the target position. Namely, with the detection of the posture of the robot arm 28 and the rotational position of the wrist axis 27 at a point of time when such a switch is operated, the target position can be detected and instructed.

In other words, the robot 10 of this embodiment is not designed to detect the target position based on a difference between an instruction value and a current value with respect to the operation of the robot arm 28, but is configured to detect the angular displacement of the wrist axis 27 upon the contact.

Therefore, there is no need for pressing the wafer 50 against the target (or cassette inner wall face 52 or 53), thus significantly reducing impact caused by the contact between the wafer 50 and the target. This can avoid or substantially eliminate generation of unwanted particles upon the contact.

Since the point of time when the wrist axis 27 begins to be angularly displaced upon the contact can be captured, the target position can be detected with high accuracy, without being affected by various fluctuation factors and other factors that may be changed with time in the drive system of the robot 10.

Additionally, the wafer 50 can be softly contacted with the target, as described above, thereby, inadvertent detachment of the wafer 50 from the hand 25 holding it by vacuum suction upon the contact between the wafer 50 and the target can be securely prevented. Due to the instruction operation by using the robot 10 with the wafer 50 being actually held thereby, significantly accurate instruction data corresponding to a real operation can be obtained.

In the above embodiment, the wafer 50 held by the hand 25 is used as a contact member for the target (or cassette 51). However, the hand 25 itself may be used as the contact member. Namely, as shown in FIG. 6, the hand 25 itself may be softly contacted with a target 54 that is optionally added, with left and right inner faces of the hand 25 being successively contacted with such a target.

In this case, the robot control unit 40 will determine a position of the target 54 in the X-Y plane, based on data of the shape and size of the hand 25 stored in the memory 41 as well as on the posture of the robot arm 28 and the angular position of the wrist axis 27 upon the contact of the hand 25 with the target 54.

Additionally, as shown in FIG. 7, the target 54 may have a columnar shape having a tapered top end portion. In this case, the data concerning such a shape of the target 54 may also be stored in the memory 41. Thereafter, the both left and right sides of the hand 25 are successively contacted with the target at a plurality of different positions in the Z-axial direction. Consequently, data about each diameter of the target 54 in the Z-axial direction can be obtained.

In this way, a position in the Z-axial direction, in which the diameter of the target 54 is changed, can be detected, based on the obtained data about each diameter in the Z-axial direction. As a result, the position of the instruction point 54A in the Z-axial direction of the target 54 can be determined.

As described above, while preferred embodiments of the present invention have been shown and discussed, these aspects can be suitably modified within the scope and sprit of this invention. For instance, while the robot in the above embodiments has been discussed as one for use in carrying the semiconductor wafers (or circular substrates), it can also be used for carrying glass substrates (or square substrates) used in manufacturing liquid crystal display panels or the like.

The invention claimed is:

1. A robot comprising:
   a robot arm having a distal end to which a wrist axis is horizontally rotatably provided;
   an arm drive unit configured to move the robot arm;
   a wrist axis drive unit configured to rotate the wrist axis; and
   a robot control unit configured to control the arm drive unit and the wrist axis drive unit,
   wherein the robot control unit is configured to:
      control the arm drive unit to move the distal end of the robot arm so as to bring a contact member attached to the wrist axis into contact with an instruction target under a state in which the wrist axis drive unit does not resist a contact reaction force from the instruction target so that an angular position thereof is freely movable,
      detect a posture of the robot arm and an angular position of the wrist axis at a point of time when the wrist axis begins to be angularly displaced due to the contact between the contact member and the instruction target, and
      determine a position of an instruction point based on detection results of the posture of the robot arm and the angular position of the wrist axis.

2. The robot according to claim 1,
   wherein the wrist axis drive unit includes a motor configured to rotate the wrist axis, and an encoder provided to the motor, and
   wherein the robot control unit is configured to detect an angular displacement of the wrist axis by changes of a position of the encoder.

3. The robot according to claim 1, further comprising an end effector attached to the wrist axis, wherein the contact member is the end effector.

4. The robot according to claim 1, further comprising an end effector attached to the wrist axis, wherein the contact member is a member held by the end effector.

5. The robot according to claim 4,
   wherein the end effector has holding unit configured to hold a plate member,
   wherein the contact member is the plate member held by the end effector, and
   wherein the instruction target is a container for containing the plate member.

6. The robot according to claim 1, wherein the robot control unit is configured to set a control loop gain of the wrist axis drive unit at substantially zero at a point of time when the contact member is expected to be in contact with the instruction target, based on a preset temporary positional data about the instruction target.

7. The robot according to claim 6, wherein the robot control unit is configured to set the control loop gain at substantially zero immediately before the point of time when the contact member is expected to be in contact with the instruction target.

8. The robot according to claim 1, wherein the robot arm is configured to be moved while having degrees of freedom in X-axial, Y-axial and Z-axial directions.

9. The robot according to claim 8, wherein the robot control unit is configured to detect a plurality of instruction points located in different positions.

10. The robot according to claim 1, wherein the wrist axis can be rotated about a rotation axis in the Z-axial direction.

11. The robot according to claim 10,
    wherein the robot arm is configured to be moved while having degrees of freedom in the X-axial, Y-axial and Z-axial directions,
    wherein the robot control unit is configured to bring the contact member into contact with the target in a plurality of different positions in the Z-axial direction, the target taking a position changed in the X-axial and Y-axial directions along the Z-axis, whereby the robot control unit can determine a position of the instruction point in the Z-axial direction based on the detection results in the plurality of different positions.

12. A method of instructing the robot defined in claim 1 about the position of the instruction point, comprising:
    moving the distal end of the robot arm by controlling the arm drive unit by using the robot control unit so as to bring the contact member attached to the wrist axis into contact with the instruction target under state in which the wrist axis drive unit does not resist a contact reaction force from the instruction target so that an angular position thereof is freely movable; and
    detecting the posture of the robot arm and the angular position of the wrist axis at the point of time when the wrist axis begins to be angularly displaced due to the contact between the contact member and the instruction target, then determining the position of the instruction point based on the detection results.

* * * * *